United States Patent
Guan (10) Patent No.: US 10,079,585 B2
(45) Date of Patent: Sep. 18, 2018

(54) LC FILTER

(71) Applicant: MURATA MANUFACTURING CO., LTD., Kyoto-fu (JP)

(72) Inventor: Yang Guan, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/452,012

(22) Filed: Mar. 7, 2017

(65) Prior Publication Data

US 2017/0179915 A1    Jun. 22, 2017

Related U.S. Application Data

(63) Continuation of application No. PCT/JP2015/064218, filed on May 18, 2015.

(30) Foreign Application Priority Data

Sep. 29, 2014    (JP) .................. 2014-198484

(51) Int. Cl.
*H03H 7/01* (2006.01)
*H03H 7/42* (2006.01)
(Continued)

(52) U.S. Cl.
CPC .............. *H03H 7/0115* (2013.01); *H01G 4/40* (2013.01); *H03H 7/427* (2013.01); *H01G 4/232* (2013.01);
(Continued)

(58) Field of Classification Search
CPC ......... H03H 2001/0085; H03H 7/0115; H03H 7/427
(Continued)

(56) References Cited

U.S. PATENT DOCUMENTS 3,603,902 A * 9/1971 Denes ...................... H01G 2/00
                                                    333/182
3,879,691 A * 4/1975 Fritz .................... H03H 1/0007
                                                    333/182
(Continued)

FOREIGN PATENT DOCUMENTS

JP    H01-119210 A    5/1989
JP    H04-313209 A    11/1992
(Continued)

OTHER PUBLICATIONS

International Search Report issued in PCT/JP2015/064218; dated Jun. 23, 2015.
(Continued)

*Primary Examiner* — Rakesh Patel
(74) *Attorney, Agent, or Firm* — Studebaker & Brackett PC (57) ABSTRACT

An LC filter that is able to obtain high insertion loss in a high-frequency band. The LC filter includes: a core including a core portion and a pair of flange portions formed at both sides of the core portion; a winding; and a pair of signal outer electrodes. At least one of the pair of flange portions is composed of a multilayer body in which inner electrodes and dielectric layers are alternately laminated, and includes a ground outer electrode. The inner electrodes include a first inner electrode and a second inner electrode alternately arranged. The first inner electrode is connected to the signal outer electrode, and the second inner electrode is connected to the ground outer electrode.

12 Claims, 8 Drawing Sheets (51) Int. Cl.
  *H01G 4/40* (2006.01)
  *H03H 1/00* (2006.01)
  *H01G 4/30* (2006.01)
  *H01G 4/232* (2006.01)

(52) U.S. Cl.
  CPC ......... *H01G 4/30* (2013.01); *H03H 2001/005* (2013.01); *H03H 2001/0085* (2013.01)

(58) Field of Classification Search
  USPC ........................................................ 333/185
  See application file for complete search history.

(56) References Cited

U.S. PATENT DOCUMENTS

| | | | | |
|---|---|---|---|---|
| 5,153,540 | A | * | 10/1992 | Gliha, Jr. ................. H01G 4/38 333/182 |
| 6,147,573 | A | * | 11/2000 | Kumagai ............ H01F 17/0013 333/185 |
| 2009/0115551 | A1 | * | 5/2009 | Kobayashi ............ H01F 17/045 333/185 |
| 2015/0096795 | A1 | * | 4/2015 | Hong ....................... H01G 4/30 174/260 |

FOREIGN PATENT DOCUMENTS

| | | |
|---|---|---|
| JP | H07-135124 A | 5/1995 |
| JP | H11-186100 A | 7/1999 |
| JP | 2002-009572 A | 1/2002 |
| JP | 2007-142931 A | 6/2007 |

OTHER PUBLICATIONS

Written Opinion issued in PCT/JP2015/064218; dated Jun. 23, 2015.

International Preliminary Report on Patentability issued in PCT/JP2015/064218; dated Apr. 4, 2017.

* cited by examiner

LC FILTER

CROSS REFERENCE TO RELATED APPLICATIONS

This application claims benefit of priority to Japanese Patent Application 2014-198484 filed Sep. 29, 2014, and to International Patent Application No. PCT/JP2015/064218 filed May 18, 2015, the entire content of which is incorporated herein by reference.

TECHNICAL FIELD

The present disclosure relates to an LC filter that is used in an electronic device or the like and particularly supports a signal in a high-frequency band.

BACKGROUND

Hitherto, an LC filter including a coil and a capacitor has been widely used as a composite electronic component for EMI (Electromagnetic Interference) removal included in an electronic device or the like.

For example, Japanese Unexamined Patent Application Publication No. 2002-009572 discloses such an LC filter.

Figure 12:
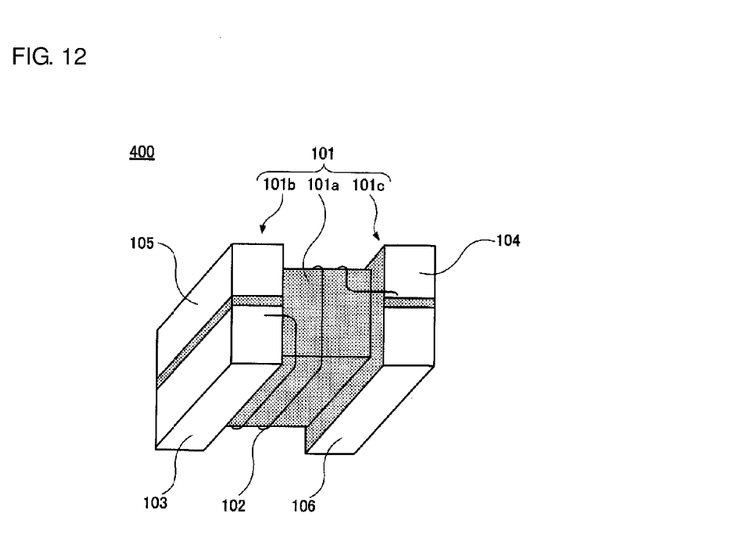
FIG. 12 is a perspective view showing an existing LC filter 400.

FIG. 12 shows an existing LC filter 400 disclosed in Japanese Unexamined Patent Application Publication No. 2002-009572.

The LC filter 400 includes a columnar core 101, a winding 102, and electrodes 103 to 106.

The core 101 is formed from alumina or the like and includes a core portion 101a and flange portions 101b and 101c formed at both ends of the core portion 101a. The core portion 101a has a smaller cross-sectional area than the flange portions 101b and 101c.

The winding 102 is composed of a metallic copper wire whose surface is coated with an insulation, and is wound on the core portion 101a.

The electrodes 103 and 105 are formed on the surface of the one flange portion 101b of the core 101. The electrode 103 and the electrode 105 are separated from each other by a gap. One end portion of the winding 102 is connected to the electrode 103. When the LC filter 400 is used, the electrode 105 is connected to a ground electrode of a circuit board or the like.

Similarly, the electrodes 104 and 106 are formed on the surface of the other flange portion 101c of the core 101. The electrode 104 and the electrode 106 are separated from each other by a gap. The other end portion of the winding 102 is connected to the electrode 104. When the LC filter 400 is used, the electrode 106 is connected to the ground electrode of the circuit board or the like.

That is, in the LC filter 400, the core portion 101a and the winding 102 form a coil portion, the electrode 103 and the electrode 105, which are separated from each other by the gap, form one capacitor portion with the flange portion 101b as a dielectric, and the electrode 104 and the electrode 106, which are separated from each other by the gap, form another capacitor portion with the flange portion 101c as a dielectric. The LC filter 400 is configured as a π type LC filter by the coil portion and the capacitor portions.

SUMMARY

Technical Problem

Due to recent high-performance and increasing speeds of CPUs of electronic devices, products have been made for higher frequencies. Therefore, there is increasing necessity for countermeasures against noise in a higher-frequency band, and there is high demand for enhancing high-frequency noise removal performance.

In such a case, for enabling removal of noise in the high-frequency band, it is necessary to cause a capacitance component of each capacitor portion to have a sufficiently high value.

However, in the existing π type LC filter 400 shown in FIG. 12, since the electrode 103 and the electrode 105, which are separated from each other by the gap, form one capacitor portion on the surface of the flange portion 101b, and the electrode 104 and the electrode 106, which are separated from each other by the gap, form another capacitor portion on the surface of the flange portion 101c, it is difficult to obtain a sufficiently high capacitance value.

Thus, in the existing π type LC filter 400, it is not possible to obtain desired sufficiently high insertion loss, so that there is a problem in that the noise removal performance in the high-frequency band is not satisfactory.

Therefore, it is an object of the present disclosure to obtain an LC filter which solves the above-described problem, and has high noise removal performance in a high-frequency band by increasing a capacitance component of a capacitor portion to increase insertion loss in the high-frequency band as compared to an existing LC filter.

Solution to Problem

The present disclosure has been made to solve the above-described problem of the related art, and as its means, an LC filter of the present disclosure includes: a core including a core portion and a pair of flange portions formed at both sides of the core portion; a winding wound on the core portion of the core; and signal outer electrodes which are formed at the pair of flange portions, respectively, and to which both ends of the winding are respectively connected, wherein at least one of the pair of flange portions is composed of a multilayer body in which inner electrodes and dielectric layers formed from a ceramic material are alternately laminated, and includes a ground outer electrode, the inner electrodes include a first inner electrode and a second inner electrode alternately arranged, the first inner electrode is connected to the signal outer electrode, and the second inner electrode is connected to the ground outer electrode.

In addition, an LC filter having another configuration of the present disclosure includes: a core including a core portion and a pair of flange portions formed at both sides of the core portion; a winding wound on the core portion of the core; and signal outer electrodes which are formed at the pair of flange portions, respectively, and to which both ends of the winding are respectively connected, wherein at least one of the pair of flange portions is composed of a multilayer body in which inner electrodes and dielectric layers formed from a ceramic material are alternately laminated, and includes a ground outer electrode, the inner electrodes include a first inner electrode, a second inner electrode, and a third inner electrode, the first inner electrode is connected to the signal outer electrode, the second inner electrode is connected to the ground outer electrode, and the third inner electrode is not connected to both the signal outer electrode and the ground outer electrode and at least partially faces the first inner electrode and the second inner electrode with the dielectric layers interposed therebetween.

Advantageous Effects of Disclosure

In the LC filter of the present disclosure, since at least one flange portion of the core is configured as a capacitor portion having a structure in which a plurality of inner electrodes and dielectric layers formed from a ceramic material are alternately laminated, it is possible to increase a capacitance component as compared to an existing LC filter in which a capacitor portion is composed of electrodes separated from each other by a gap on the surface of a flange portion. Therefore, it is possible to obtain high insertion loss in a high-frequency band. In addition, since the capacitor portion has a laminated structure, it is possible to easily adjust the capacitance value of the capacitor portion by adjusting the number of laminated layers, and it is possible to easily obtain desired insertion loss. Accordingly, a circuit using the LC filter of the present disclosure has increased flexibility in circuit design and thus is able to reduce the cost of the entire circuit.

Figure 11:
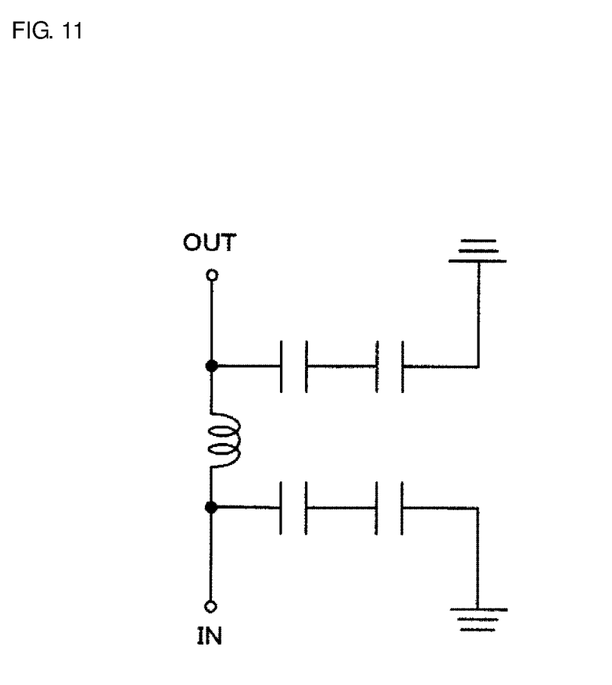
FIG. 11 is an equivalent circuit diagram of the LC filter 300.

Additionally, in the LC filter including the third inner electrode, a capacitor portion has a configuration in which a plurality of capacitors are connected in series (see FIG. 11). Thus, in addition to the above effect, an effect is also achieved that occurrence of a short circuit in the capacitor portion is prevented by a fall in a voltage applied to one series-connected capacitor.

BRIEF DESCRIPTION OF THE DRAWINGS

FIGS. 5(A) and (B) are a continuation of FIG. 4 and are each a cross-sectional view showing another step performed in the example of the method for producing the LC filter 100.

FIGS. 6(A), (B), and (C) are a continuation of FIG. 5 and are each a cross-sectional view showing another step performed in the example of the method for producing the LC filter 100.

DETAILED DESCRIPTION

Hereinafter, embodiments of the present disclosure will be described with reference to the drawings.

First Embodiment

Figure 1A:
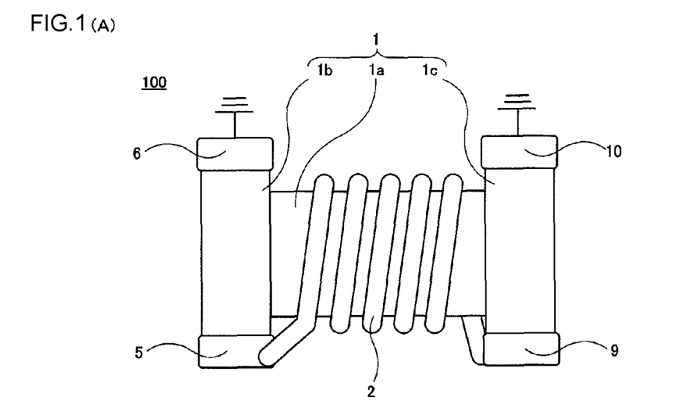
FIG. 1(A) is a front view showing an LC filter 100 according to a first embodiment.
Figure 1B:
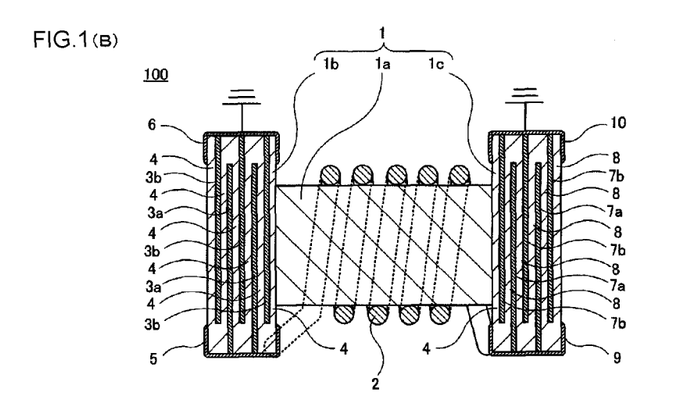
FIG. 1(B) is a cross-sectional view of the LC filter 100.

FIGS. 1(A) and 1(B) show an LC filter 100 according to a first embodiment. FIG. 1(A) is a front view, and a FIG. 1(B) is a cross-sectional view.

The LC filter 100 includes a core 1 and a winding 2.

The core 1 includes a core portion 1a and flange portions 1b and 1c formed at both ends of the core portion 1a, respectively. The core portion 1a is formed from, for example, ferrite. The material of the core portion 1a may be any material, and may be, for example, a metallic material.

The flange portion 1b is composed of a rectangular-parallelepiped-shaped multilayer body in which first inner electrodes 3a, second inner electrodes 3b, and dielectric layers formed from a ceramic material are laminated in a winding direction of the core portion 1a. The first inner electrodes 3a and the second inner electrodes 3b are disposed within the multilayer body so as to face each other with the dielectric layers 4 interposed therebetween, to form a capacitor portion.

Each of the numbers of the laminated first inner electrodes 3a and the laminated second inner electrodes 3b only needs to be one or more, and is freely adjustable. Thus, the capacitance value of the capacitor portion is easily adjustable.

For example, nickel or silver may be used for the first inner electrodes 3a and the second inner electrodes 3b. For example, a barium titanate-based dielectric material or the like may be used for the dielectric layers 4.

A signal outer electrode 5 is formed at one end portion of the flange portion 1b. The first inner electrodes 3a are connected to the signal outer electrode 5. When the LC filter 100 is used, the signal outer electrode 5 is connected to a signal line formed on a mother board or the like.

A ground outer electrode 6 is formed at the other end portion of the flange portion 1b. The second inner electrodes 3b are connected to the ground outer electrode 6. When the LC filter 100 is used, the ground outer electrode 6 is connected to ground formed on the mother board or the like.

Each of the signal outer electrode 5 and the ground outer electrode 6 is formed of, for example, a silver-baked electrode.

As described above, the flange portion 1b of the LC filter 100 forms the one capacitor portion.

Similarly, the flange portion 1c is composed of a rectangular-parallelepiped-shaped multilayer body in which first inner electrodes 7a, second inner electrodes 7b, and dielectric layers 8 formed from a ceramic material are laminated in the winding direction of the core portion 1a. The first inner electrodes 7a and the second inner electrodes 7b are disposed within the multilayer body so as to face each other with the dielectric layers 8 interposed therebetween, to form another capacitor portion.

Each of the numbers of the laminated first inner electrodes 7a and the laminated second inner electrodes 7b only needs to be one or more, and is freely adjustable. Thus, the capacitance value of the capacitor portion is easily adjustable.

For example, nickel or silver may be used for the first inner electrodes 7a and the second inner electrodes 7b. For example, a barium titanate-based dielectric material or the like may be used for the dielectric layers 8.

A signal outer electrode 9 is formed at one end portion of the flange portion 1c. The first inner electrodes 7a are connected to the signal outer electrode 9. When the LC filter 100 is used, the signal outer electrode 9 is connected to a signal line formed on the mother board or the like.

A ground outer electrode 10 is formed at the other end portion of the flange portion 1c. The second inner electrodes 7b are connected to the ground outer electrode 10. When the LC filter 100 is used, the ground outer electrode 10 is connected to the ground formed on the mother board or the like.

Each of the signal outer electrode 9 and the ground outer electrode 10 is formed of, for example, a silver-baked electrode.

As described above, the flange portion 1c of the LC filter 100 forms the other capacitor portion.

The winding 2 is spirally wound on the core portion 1a of the core 1. The core portion 1a and the winding 2 form a coil portion, and one end portion of the winding 2 is connected to the signal outer electrode 5, and the other end portion of the winding 2 is connected to the signal outer electrode 9. For example, a copper wire coated with an insulating material such as a polyurethane resin, or the like may be used as the winding 2.

Figure 2:
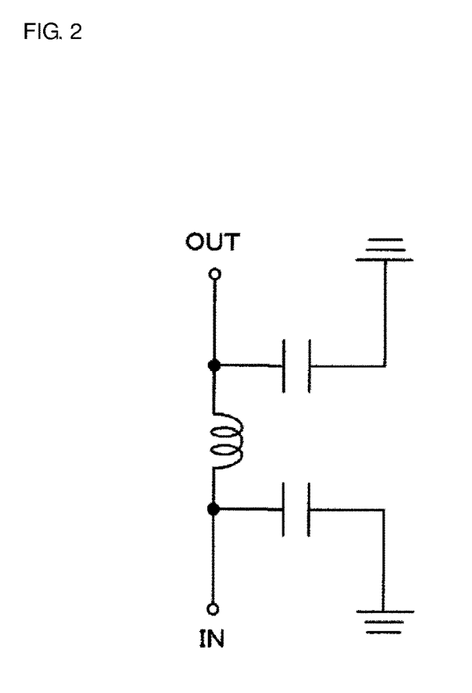
FIG. 2 is an equivalent circuit diagram of the LC filter 100.

The LC filter 100 according to the first embodiment having the structure described above includes an equivalent circuit shown in FIG. 2. That is, the LC filter 100 forms a π type LC filter with the one coil portion and the two capacitor portions.

The LC filter 100 according to the first embodiment having the structure and the equivalent circuit described above has the following characteristics.

Figure 3:
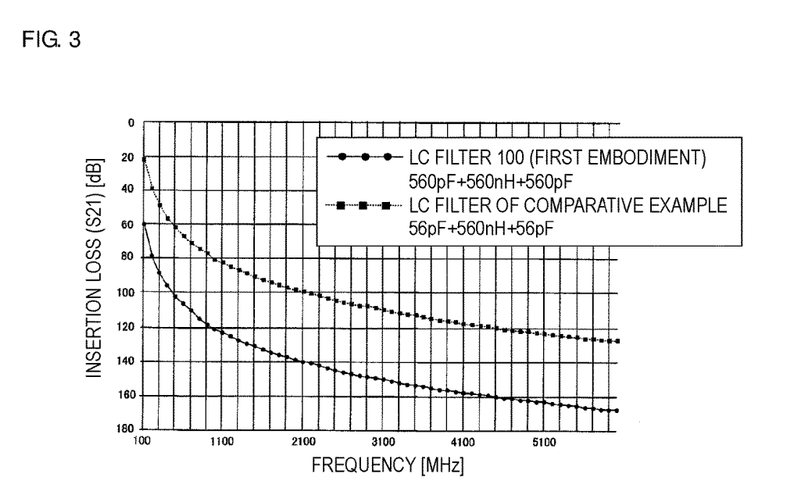
FIG. 3 is a graph showing the insertion loss characteristics of the LC filter 100 in comparison with an existing LC filter.

FIG. 3 shows the insertion loss characteristics of the LC filter 100 according to the first embodiment. It should be noted that FIG. 3 also shows the insertion loss characteristics of an LC filter of a comparative example having the same equivalent circuit.

The LC filter 100 according to the first embodiment is able to sufficiently increase the capacitance value of each capacitor portion, since the LC filter 100 has the structure described above. The two capacitor portions of the LC filter 100 each have a capacitance value of 560 pF. The coil portion of the LC filter 100 has an inductance value of 560 nH.

The insertion loss characteristics of the LC filter of the comparative example are created by using simulation software "Femtet" (manufactured by Murata Manufacturing Co., Ltd.). In the LC filter of the comparative example, the capacitance values of two capacitor portions are made lower than those of the LC filter 100 according to the first embodiment and are set to 56 pf. This assumes the case of the related art where the capacitance values of the capacitor portions cannot be increased, for example, as in the existing LC filter 400 shown in FIG. 12. Meanwhile, the inductance value of a coil portion of the LC filter of the comparative example is set to 560 nH similarly to the LC filter 100.

As is seen from FIG. 3, in the LC filter 100 according to the first embodiment, the insertion loss characteristics in the frequency band of 1 GHz to 5 GHz are higher than those of the LC filter of the comparative example by about 20 dB. From the result, according to the LC filter of the present disclosure, it appears that it is possible to remove noise in a high-frequency band, which cannot be achieved by the existing product.

Next, an example of a method for producing the LC filter 100 according to the first embodiment will be described. The LC filter 100 is produced by, for example, the following method.

FIGS. 4 to 6(C) show a production process for the core 1. Normally, a large number of cores 1 are produced simultaneously. However, in FIGS. 4 to 6(C), a production process for three cores 1 is shown for the convenience of explanation.

Figure 4:
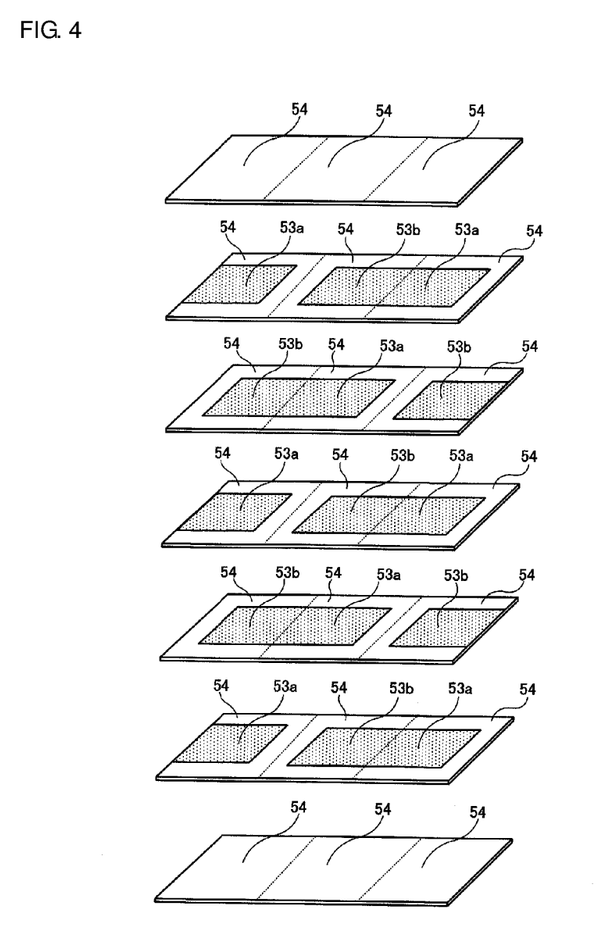
FIG. 4 is an exploded perspective view showing one step performed in an example of a method for producing the LC filter 100.
Figure 5:
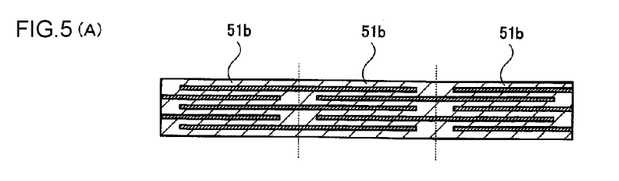
Figure 6:
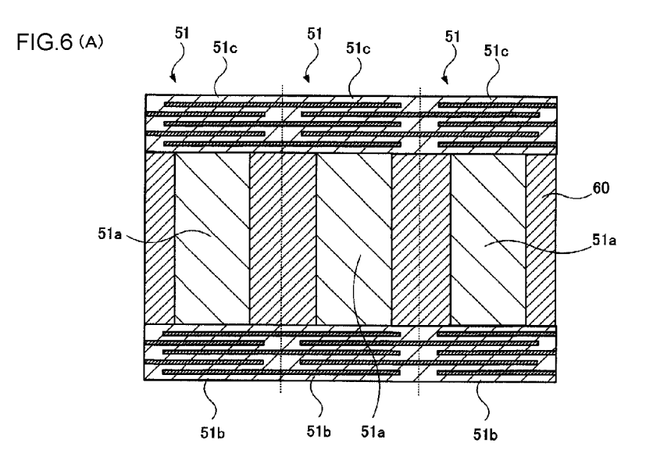

First, as shown in FIG. 4, three dielectric sheets 54 that are connected to each other and in which no inner electrodes are formed, are prepared as a first layer and a seventh layer (uppermost layer) of the flange portion 1b. The three dielectric sheets 54 are connected to each other.

In addition, a plurality of printed dielectric sheets 54 in which first inner electrode patterns 53a and second inner electrode patterns 53b have been formed by printing dielectric sheets with a paste containing nickel as a principal component, are prepared as second and third layers of the flange portions 1b. The three printed dielectric sheets 54 are connected to each other.

Next, as shown in FIG. 5(A), the dielectric sheets 54 for the first to seventh layers described above are stacked and subsequently pressed to form three unfired flange portions 51b.

Next, as shown in FIG. 5(B), printing is repeatedly performed with a ferrite paste in a predetermined pattern until a predetermined thickness is obtained, thereby forming an unfired core portion 51a on each of the three unfired flange portions 51b. Then, portions on the three unfired flange portions 51b which have not been printed with the ferrite paste, are filled with a resin 60 which is composed of, for example, polyimide and is burned down when being fired.

Next, the resin 60 covering the upper surface of the ferrite paste is removed, and then the surface is smoothed such that each core portion 51a is exposed.

Next, as shown in FIG. 6(A), three unfired flange portions 51c are produced by the same method as for the above-described three unfired flange portions 51b and are bonded to the three unfired core portions 51a exposed from the resin 60, to obtain three unfired cores 51.

Next, as shown in FIG. 6(B), the three unfired cores 51 are cut into individual unfired cores 51.

Next, as shown in FIG. 6(C), the unfired core 51 is baked, for example, at 800° C. to 1000° C. to complete the core 1 in which the flange portion 1b and the flange portion 1c each forming a capacitor portion are formed at both ends of the core portion 1a.

Next, although not shown, a silver paste is applied and baked on predetermined portions of the surfaces of the flange portions 1b and 1c of the core 1, to form the signal outer electrodes 5 and 9 and the ground outer electrodes 6 and 10.

Finally, the winding 2 is wound on the core portion 1a of the core 1, one end portion thereof is connected and fixed to the signal outer electrode 5, and the other end portion thereof is connected and fixed to the signal outer electrode 9, to complete the LC filter 100 according to the first embodiment.

Examples of the structure, the equivalent circuit, and the production method of the LC filter 100 according to the first embodiment have been described above. However, the present disclosure is not limited to the above-described contents, and various modifications may be made according to the gist of the present disclosure.

For example, the LC filter 100 is a π type filter including one coil portion and two capacitor portions, but the number of coil portions or capacitor portions, the type of the LC filter, and the like are arbitrary and are not limited thereto.

In addition, the inner structure of each capacitor portion is arbitrary, and the number or the structures of the inner electrodes may be freely changed.

Second Embodiment

Figure 7:
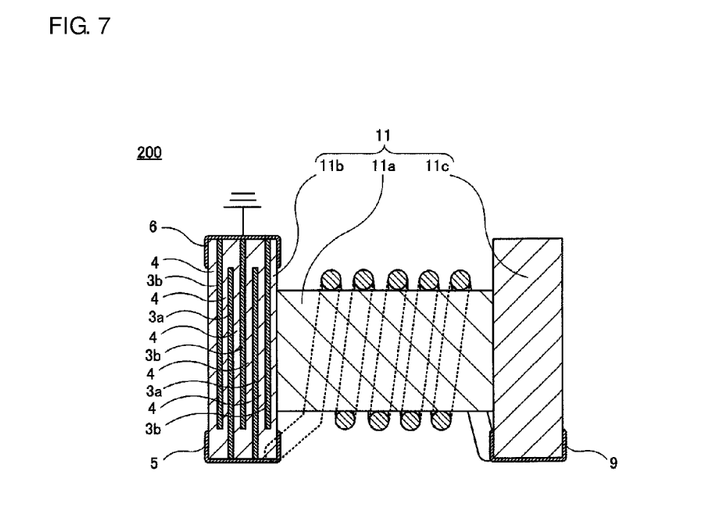
FIG. 7 is a cross-sectional view showing an LC filter 200 according to a second embodiment.

FIG. 7 shows an LC filter 200 according to a second embodiment. FIG. 7 is a cross-sectional view.

The LC filter 200 includes a core 11 and a winding 2.

The core 11 includes a core portion 11a, a flange portion 11b formed at one end portion of the core portion 11a, and a flange portion 11c formed at the other end portion of the core portion 11a. In the LC filter 200, only the flange portion 11b forms a capacitor portion, and the flange portion 11c does not form a capacitor portion.

That is, the core portion 11a of the LC filter 200 has the same structure as the core portion 1a of the LC filter 100 according to the first embodiment. In addition, the flange portion 11b of the LC filter 200 has the same structure as the flange portion 1b of the LC filter 100. However, unlike the structure of the flange portion 1c of the LC filter 100, the flange portion 11c of the LC filter 200 does not include any inner electrode therein. For example, ferrite may be used as the material of the flange portion 1c.

The other structure of the LC filter 200 is the same as that of the LC filter 100 according to the first embodiment.

Figure 8:
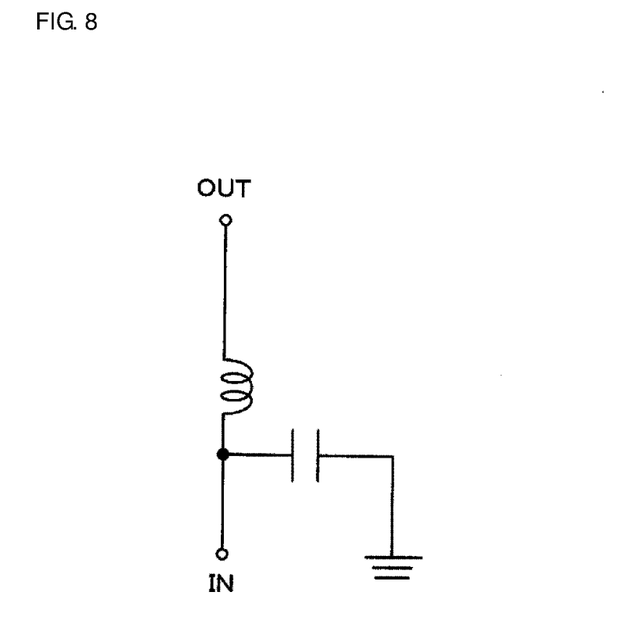
FIG. 8 is an equivalent circuit diagram of the LC filter 200.

The LC filter 200 according to the second embodiment includes an equivalent circuit shown in FIG. 8. That is, the LC filter 200 forms a so-called L type LC filter with one coil portion and one capacitor portion.

Figure 9:
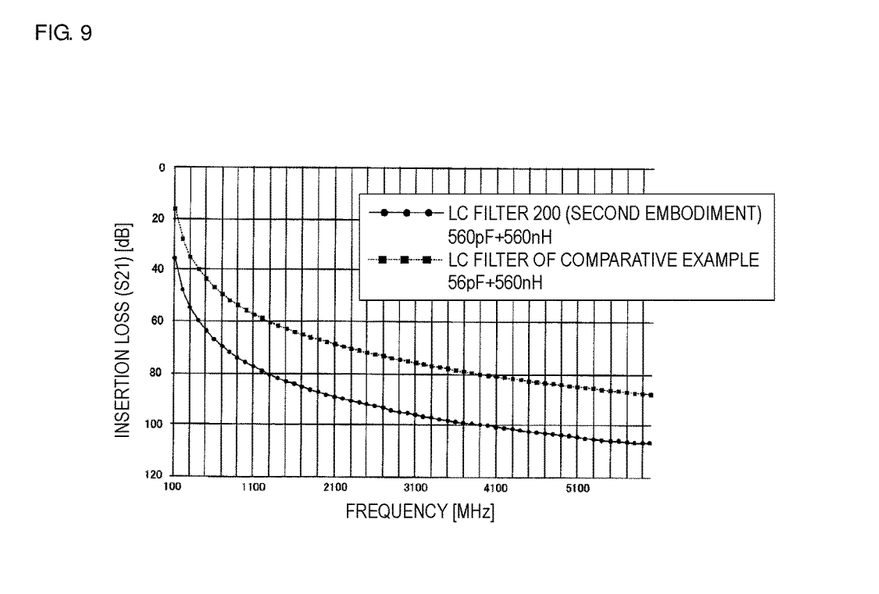
FIG. 9 is a graph showing the insertion loss characteristics of the LC filter 200 in comparison with an existing LC filter.

FIG. 9 shows the insertion loss characteristics of the LC filter 200 according to the second embodiment. It should be noted that FIG. 9 also shows the insertion loss characteristics of an LC filter of a comparative example having the same equivalent circuit.

The capacitor portion of the LC filter 200 according to the second embodiment has a capacitance value of 560 pF. The coil portion of the LC filter 200 has an inductance value of 560 nH.

The insertion loss characteristics of the LC filter of the comparative example are created by using simulation software "Femtet" (manufactured by Murata Manufacturing Co., Ltd.). In the LC filter of the comparative example, the capacitance value of the capacitor portion is set to 56 pF which is lower than that of the LC filter 200 according to the second embodiment. This assumes the case of the related art where the capacitance value of the capacitor portions cannot be increased. Meanwhile, the inductance value of a coil portion of the LC filter of the comparative example is set to 560 nH similarly to the LC filter 200.

As is seen from FIG. 9, in the LC filter 200 according to the second embodiment, the insertion loss characteristics in the frequency band of 1 GHz to 5 GHz are higher than those of the LC filter of the comparative example by about 20 dB. From the result, also in the LC filter 200 of the second embodiment, it appears that it is possible to remove noise in a high-frequency band, which cannot be achieved by the existing product.

The LC filter 200 according to the second embodiment also achieves an effect that stability of connection with the ground is excellent. That is, if an LC filter is connected to ground at a plurality of locations, a potential difference occurs even slightly, so that connectivity with the ground becomes unstable in some cases. However, the LC filter 200 is connected to the ground at one location, and thus has excellent stability of connection with the ground.

Third Embodiment

Figure 10:
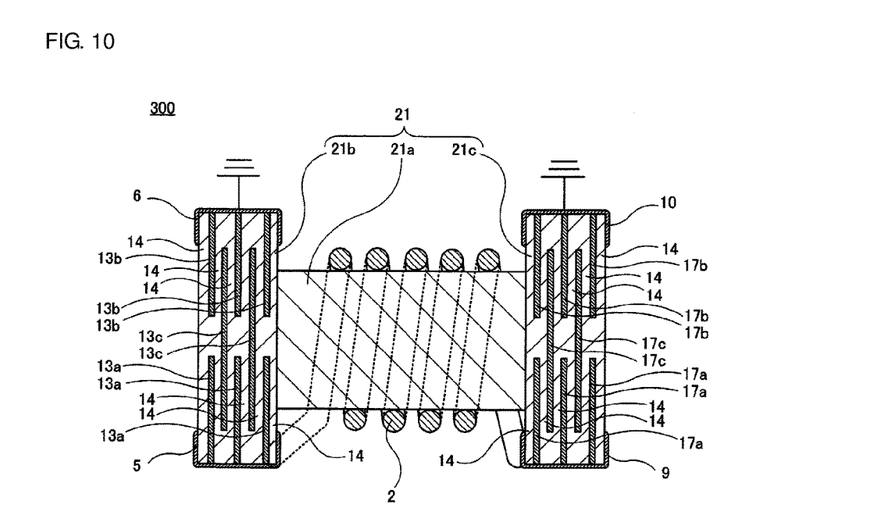
FIG. 10 is a cross-sectional view showing an LC filter 300 according to a third embodiment.

FIG. 10 shows an LC filter 300 according to a third embodiment. FIG. 10 is a cross-sectional view.

The LC filter 300 includes a core 21 and a winding 2.

Similarly to the LC filter 100 according to the first embodiment, the core 21 of the LC filter 300 also includes flange portions 21b and 21c at both ends of a core portion 21a, respectively. Each of the flange portions 21b and 21c forms a capacitor portion.

However, the configurations of inner electrodes of the flange portions 21b and 21c of the LC filter 300 are different from those of the flange portions 1b and 1c of the LC filter 100 according to the first embodiment.

That is, the flange portion 21b includes first inner electrodes 12a connected to a signal outer electrode 5, second inner electrodes 13b connected to a ground outer electrode 6, and further third outer electrodes 13c which are floating electrodes and are not connected to both the signal outer electrode 5 and the ground outer electrode 6. The third outer electrodes 13c at least partially face the first inner electrodes 13a and the second inner electrodes 13b with dielectric layers 14 interposed therebetween.

In addition, the flange portion 21c includes first inner electrodes 17a connected to a signal outer electrode 9, second inner electrodes 17b connected to a ground outer electrode 10, and further third outer electrodes 17c which are floating electrodes and are not connected to both the signal outer electrode 9 and the ground outer electrode 10. The third outer electrodes 17c at least partially face the first inner electrodes 17a and the second inner electrodes 17b with dielectric layers 14 interposed therebetween.

The other structure of the LC filter 300 is the same as that of the LC filter 100 according to the first embodiment.

The LC filter 300 according to the third embodiment includes an equivalent circuit shown in FIG. 11. That is, the LC filter 300 forms a π type LC filter including a coil portion and two capacitor portions, but each capacitor portion is composed of two capacitors connected in series. As a result, the LC filter 300 achieves not only the above-described effect specific to the present disclosure but also an effect that occurrence of a short circuit in each capacitor portion is prevented by a fall in a voltage applied to a one series-connected capacitor.

The invention claimed is:

1. An LC filter comprising:
a core including a core portion and a pair of flange portions formed at two sides of the core portion, wherein each flange portion extends beyond the core portion in a direction perpendicular to a longitudinal axis of the core portion;
a winding wound on the core portion of the core, the winding being a single, unitary wire composed of a metallic copper wire whose surface is coated with an insulation; and
signal outer electrodes which are formed at the pair of flange portions, respectively, and to which two ends of the winding are respectively connected, wherein
at least one of the pair of flange portions is composed of a multilayer body in which inner electrodes and dielectric layers formed from a ceramic material are alternately laminated, and includes a ground outer electrode,
the inner electrodes include a first inner electrode and a second inner electrode alternately arranged,
the first inner electrode is connected to the signal outer electrode of at least one of the pair of flange portions, and
the second inner electrode is connected to the ground outer electrode.

2. An LC filter comprising:
a core including a core portion and a pair of flange portions formed at two sides of the core portion, wherein each flange portion extends beyond the core portion in a direction perpendicular to a longitudinal axis of the core portion;
a winding wound on the core portion of the core, the winding being a single, unitary wire composed of a metallic copper wire whose surface is coated with an insulation; and
signal outer electrodes which are formed at the pair of flange portions, respectively, and to which two ends of the winding are respectively connected, wherein at least one of the pair of flange portions is composed of a multilayer body in which inner electrodes and dielectric layers formed from a ceramic material are alternately laminated, and includes a ground outer electrode, the inner electrodes include a first inner electrode, a second inner electrode, and a third inner electrode, the first inner electrode is connected to the signal outer electrode of at least one of the pair of flange portions, the second inner electrode is connected to the ground outer electrode, and the third inner electrode is not connected to both the signal outer electrodes and the ground outer electrode and at least partially faces the first inner electrode and the second inner electrode with the dielectric layers interposed therebetween.

3. The LC filter of claim 2, wherein the core portion is one of a ferrite and a metallic material.

4. The LC filter of claim 2, wherein each signal outer electrode respectively covers an edge of the corresponding flange portion that extends beyond the core portion such that each signal outer electrode has a major face extending parallel to the longitudinal axis of the core portion.

5. The LC filter of claim 2, wherein the winding makes contact with each of the signal outer electrodes at locations outside the core portion.

6. The LC filter of claim 2, wherein the inner electrodes include multiple first inner electrodes and multiple second inner electrodes alternately arranged, with each of the first inner electrodes being directly connected to the signal outer electrodes, and each of the second inner electrodes being directly connected to the ground outer electrode.

7. The LC filter of claim 2, wherein the first, second and third inner electrodes together form two capacitors connected in series.

8. The LC filter of claim 1, wherein the core portion is one of a ferrite and a metallic material.

9. The LC filter of claim 1, wherein each signal outer electrode respectively covers an edge of the corresponding flange portion that extends beyond the core portion such that each signal outer electrode has a major face extending parallel to the longitudinal axis of the core portion.

10. The LC filter of claim 1, wherein the winding makes contact with each of the signal outer electrodes at locations outside the core portion.

11. The LC filter of claim 1, wherein the inner electrodes include multiple first inner electrodes and multiple second inner electrodes alternately arranged, with each of the first inner electrodes being directly connected to the signal outer electrodes, and each of the second inner electrodes being directly connected to the ground outer electrode.

12. An LC filter comprising:
a core including a core portion and a pair of flange portions formed at two sides of the core portion, wherein the core portion is one of a ferrite and a metallic material, and wherein each flange portion extends beyond the core portion in a direction perpendicular to a longitudinal axis of the core portion;

a winding wound on the core portion of the core, the winding being a single, unitary wire composed of a metallic copper wire whose surface is coated with an insulation; and signal outer electrodes which are formed at the pair of flange portions, respectively, and to which two ends of the winding are respectively connected, wherein each signal outer electrode respectively covers an edge of a corresponding flange portion that extends beyond the core portion such that the signal outer electrode has a major face extending parallel to the longitudinal axis of the core portion, at least one of the pair of flange portions is composed of a multilayer body in which inner electrodes and dielectric layers formed from a ceramic material are alternately laminated, and includes a ground outer electrode, the inner electrodes include multiple first inner electrodes and multiple second inner electrodes alternately arranged, each of the first inner electrodes are directly connected to the signal outer electrode of the at least one of the pair of flange portions, each of the second inner electrodes are directly connected to the ground outer electrode, and the winding makes contact with each of the signal outer electrodes at locations outside the core portion.

* * * * *